(12) United States Patent
Ifuku et al.

(10) Patent No.: US 7,279,825 B2
(45) Date of Patent: Oct. 9, 2007

(54) DIELECTRIC THIN FILM ELEMENT, PIEZOELECTRIC ACTUATOR AND LIQUID DISCHARGE HEAD, AND METHOD FOR MANUFACTURING THE SAME

(75) Inventors: Toshihiro Ifuku, Kanagawa (JP); Takanori Matsuda, Kanagawa (JP); Tetsuro Fukui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 11/006,639

(22) Filed: Dec. 8, 2004

(65) Prior Publication Data

US 2005/0127780 A1 Jun. 16, 2005

(30) Foreign Application Priority Data

Dec. 10, 2003 (JP) ............... 2003-411167

(51) Int. Cl.
*H01L 41/087* (2006.01)
(52) U.S. Cl. ..................................... 310/358
(58) Field of Classification Search ................. 310/358
See application file for complete search history.

(56) References Cited

U.S. PATENT DOCUMENTS

| | | | |
|---|---|---|---|
| 6,347,862 B1 * | 2/2002 | Kanno et al. ................ | 347/68 |
| 6,653,211 B2 | 11/2003 | Unno et al. | |
| 6,781,176 B2 * | 8/2004 | Ramesh ..................... | 257/295 |
| 6,841,490 B2 | 1/2005 | Unno et al. | |
| 6,854,832 B2 | 2/2005 | Matsuda | |
| 6,927,084 B2 | 8/2005 | Fukui et al. | |
| 6,960,539 B2 * | 11/2005 | Higuchi et al. ............ | 438/778 |
| 2002/0076875 A1 | 6/2002 | Wasa et al. | |
| 2002/0140320 A1 | 10/2002 | Unno et al. | |
| 2003/0160329 A1 * | 8/2003 | Lee et al. ................... | 257/760 |
| 2004/0066116 A1 | 4/2004 | Matsuda et al. | |
| 2004/0155559 A1 | 8/2004 | Ifuku et al. | |
| 2004/0207695 A1 | 10/2004 | Aoto et al. | |
| 2005/0168112 A1 | 8/2005 | Aoki et al. | |
| 2005/0179342 A1 * | 8/2005 | Higuchi et al. ............ | 310/324 |
| 2005/0189849 A1 | 9/2005 | Ifuku et al. | |
| 2006/0138906 A1 * | 6/2006 | Iwashita et al. ........... | 310/358 |
| 2007/0024162 A1 * | 2/2007 | Shibata et al. ............. | 310/358 |
| 2007/0029592 A1 * | 2/2007 | Ramesh ..................... | 257/295 |

FOREIGN PATENT DOCUMENTS

| | | |
|---|---|---|
| JP | 7-300397 | 11/1995 |
| JP | 10-286953 | 10/1998 |
| JP | 2003209303 A * | 7/2003 |
| WO | WO 2004/068605 | 8/2004 |

* cited by examiner

*Primary Examiner*—J San Martin
(74) *Attorney, Agent, or Firm*—Fitzpatrick, Cella, Harper & Scinto

(57) ABSTRACT

In piezoelectric thin films constituting crystalline dielectric thin film elements used for a piezoelectric actuator of a liquid discharge head, stress is generated in the crystallization step by heating due to the lattice misfit. Given this fact, by interposing between a substrate and intermediate layer which has a twin structure that absorbs the stress, film peeling and deterioration of the piezoelectric properties of the piezoelectric thin films are prevented. The intermediate layer is of a multi-layer structure which has a first intermediate layer comprising a twin structure thin film and a second intermediate layer which is the lower electrode, and because the substrate also serves as a lower electrode, the intermediate layer has a single layer structure comprising a twin structure thin film.

9 Claims, 7 Drawing Sheets

DIELECTRIC THIN FILM ELEMENT, PIEZOELECTRIC ACTUATOR AND LIQUID DISCHARGE HEAD, AND METHOD FOR MANUFACTURING THE SAME

BACKGROUND OF THE INVENTION

1. Field of the Invention

The present invention relates to a dielectric thin film element for a piezoelectric actuator using a dielectric thin film, a piezoelectric actuator and a liquid discharge head, and a method for manufacturing the same. The dielectric thin film element of the present invention can be applied to not only piezoelectric actuators used for a liquid discharge head but also various sensors, non-volatile memories and capacitor insulating film for DRAM.

2. Related Background Art

A thin film material recently attracting attention is a dielectric material having a perovskite structure constituted by the formula $ABO_3$. Since the material has excellent ferroelectric property, pyroelectric property, piezoelectric property and dielectric property as represented by $Pb(Zr,Ti)O_3$, application to piezoelectric actuators for liquid discharge heads, microphones, sounding bodies (e.g., speakers), various transducer sensors, non-volatile memories, capacitor insulating film for DRAM is expected utilizing the above characteristics.

To improve the properties of these materials or to achieve integration thereof, formation of thin film is extremely important. For example, further downsizing and high-functioning of piezoelectric actuators by using a piezoelectric thin film has led to the development of applications to micromachines, microsensors and liquid discharge heads, and it is expected that micro-size and accurate handling can be achieved in various fields, which has been considered impossible.

In the case of a liquid discharge recording apparatus equipped with a piezoelectric actuator using a piezoelectric driving element, a vibrating plate equipped with the piezoelectric driving element is jointed to a flow path substrate having a pressure chamber communicated to a liquid supply chamber such as an ink chamber and a discharge port (nozzle) communicated to the pressure chamber, while the vibrating plate being faced with the pressure chamber. In such construction, by expanding and contracting the piezoelectric driving element by applying a pre-determined voltage thereto, flexibility vibration is induced to compress liquid such as ink in the pressure chamber and droplets are discharged from the discharge port.

At present, color ink jet recording apparatuses have been widely used, but improvement of printing abilities, in particular, high resolution and high-speed printing, are demanded and high resolution and high-speed printing has been attempted by using a multi nozzle head structure which is a micro-processed liquid discharge head. For the microfabrication of the liquid discharge head, downsizing of piezoelectric driving element for discharging liquid is necessary.

Conventionally, a piezoelectric film manufactured by micro-profiling of a piezoelectric body obtained by sintering based on techniques such as cutting and grinding has been used for such compact piezoelectric driving element. Aside from this, research has been conducted to develop a high precision, micro piezoelectric driving element by laminating a piezoelectric body as a thin film and utilizing photolithographic processing technique used for semiconductors. In addition, in view of the high functioning of the element, it is desired that the piezoelectric body is a single crystal or single oriented dielectric thin film, and development of heteroepitaxial growth technique has been extended.

In the technique of heteroepitaxial growth of dielectric thin film, it is important to reduce the misfit of the lattice constant between the base layers including a substrate and the dielectric thin film. A method of inserting an intermediate layer between the substrate and the dielectric thin film for reducing the lattice misfit is general and widely known.

On the other hand, a technique of forming a dielectric thin film having a high single orientation degree has been studied despite that the substrate and the dielectric thin film have no epitaxial relation. For example, as described in Japanese Patent Application Laid-Open No. H07-300397, a method for obtaining a highly oriented piezoelectric thin film by utilizing the difference in the linear expansion coefficient of the substrate and the dielectric thin film has been suggested.

However, in the above conventional epitaxial film forming techniques and a film forming method utilizing the difference in the thermal expansion coefficient of the substrate and the dielectric thin film as represented by Japanese Patent Application Laid-Open No. H07-300397, stress due to the lattice misfit or the difference in thermal expansion coefficient is generated in the dielectric thin film to cause peeling of the film, whereby construction of a large area dielectric thin film element has been prevented.

Even in the case where peeling of the film is not caused, the stress generated in the dielectric thin film leads to deterioration of properties of the dielectric thin film, such as fatigue characteristics of FeRAM, whereby formation of the dielectric thin film element has been prevented.

In particular, since piezoelectric actuators such as a liquid discharge head used for micromachines and ink jet recording apparatuses which have been extensively studied recently and in which the dielectric thin film undergoes displacement have a large film thickness of about 0.5 µm to 500 µm and have piezoelectric displacement, the problem of the peeling of the dielectric thin film from the substrate or the intermediate layer is essential.

SUMMARY OF THE INVENTION

The present invention has been made in view of the above problems of the conventional arts and aims at providing a dielectric thin film element which enables construction of a large area dielectric thin film such as a single crystal or single oriented piezoelectric thin film by interposing a twin-structure intermediate layer between the substrate or the base layer, relaxing the stress generated in the dielectric thin film to prevent film peeling due to the stress and deterioration of the properties of the dielectric thin film, a piezoelectric actuator and a liquid discharge head, and a manufacturing method thereof.

In order to achieve the above-mentioned object, the dielectric thin film element of the present invention comprises an intermediate layer formed on a substrate and a single crystal or single oriented dielectric thin film formed on the intermediate layer, wherein the intermediate layer has a twin structure.

The piezoelectric actuator of the present invention comprises a vibrating plate, an intermediate layer formed on the vibrating plate and a single crystal or single oriented piezoelectric thin film formed on the intermediate layer, wherein the intermediate layer has a twin structure.

It is preferable that the piezoelectric thin film is a zinc piezoelectric thin film and the intermediate layer has a thin film of $PbTiO_3$ or $SrRuO_3$.

The liquid discharge head of the present invention pressurizes liquid in the pressure chamber by piezoelectric driving force to discharge the liquid through a discharge port, and comprises a flow path substrate equipped with the pressure chamber, a vibrating plate put on the flow path substrate, an intermediate layer formed on the vibrating plate, a single crystal or single oriented piezoelectric thin film formed on the intermediate layer and an electrode for supplying current to the piezoelectric thin film, wherein the intermediate layer has a twin structure.

It is preferable that the intermediate layer has a tetragonal thin film and (001) is the main growing plane.

It is preferable that the intermediate layer has an orthorhombic thin film and (001) is the main growing plane.

It is preferable that the twin plane of the intermediate layer is (101) or (011).

It is preferable that the twin-structure thin film has a film thickness of 1 to 200 nm.

The method for manufacturing a liquid discharge head of the present invention is a method for manufacturing a liquid discharge head which pressurizes liquid in a pressure chamber by piezoelectric driving force to discharge the liquid through a discharge port, which comprises the steps of forming a vibrating plate on a flow path substrate on which the pressure chamber is formed, forming an intermediate layer on the vibrating plate, forming a thin film having a twin structure by heating the intermediate layer, forming a single crystal or single oriented piezoelectric thin film on the thin film having a twin structure and forming an electrode for supplying current to the piezoelectric thin film.

In addition, the method for manufacturing a liquid discharge head of the present invention may be a method for manufacturing a liquid discharge head which pressurizes liquid in a pressure chamber by piezoelectric driving force to discharge the liquid through a discharge port, which comprises the steps of forming a vibrating plate on the flow path substrate on which the pressure chamber is formed, forming an intermediate layer on the intermediate transferring member, forming a thin film having a twin structure by heating the intermediate layer, forming a single crystal or single oriented piezoelectric thin film on the thin film having a twin structure, transferring the piezoelectric thin film and the intermediate layer which are on the intermediate transferring member to the vibrating plate of the flow path substrate and forming an electrode for supplying current to the piezoelectric thin film.

A dielectric thin film such as a piezoelectric material is epitaxially grown on the vibrating plate or the substrate which is an intermediate transferring member of a liquid discharge head via a twin-structure intermediate layer. Because the stress generated in the film by lattice misfit is absorbed by the twin structure of the intermediate layer when conducting single crystallization or other treatment for imparting piezoelectric property to the dielectric thin film, film peeling by the stress or deterioration of the piezoelectric properties can be prevented. According to this, construction of a large area piezoelectric thin film having a superior piezoelectric property can be achieved and high functioning and low cost of liquid discharge heads equipped with a piezoelectric actuator can be facilitated.

BRIEF DESCRIPTION OF THE DRAWINGS

FIG. 2A is a schematic cross-section thereof and FIG. 2B is a partial plan view thereof;

DESCRIPTION OF THE PREFERRED EMBODIMENTS

Figure 1A:
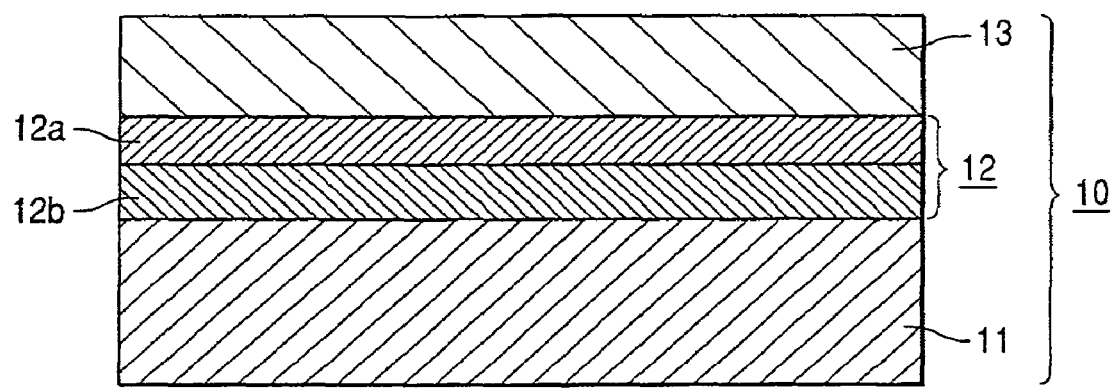
FIGS. 1A and 1B are views illustrating a film configuration of a dielectric thin film element according to a first embodiment and of a modified example thereof.

As shown in FIG. 1A, a dielectric thin film element 10 which is a piezoelectric driving element is formed by a substrate 11, an intermediate layer 12 having a multi-layer structure laminated on the substrate 11 and a piezoelectric thin film 13 formed thereon.

The piezoelectric thin film 13 is a single crystal or highly oriented dielectric thin film which has a thickness of 0.5 to 500 µm, and the intermediate layer 12 has the first intermediate layer 12a which is a thin film having a twin structure and located under the piezoelectric thin film 13 and the second intermediate layer 12b thereunder.

It is preferable that the substrate 11 is a single crystal substrate of $SrTiO_3$, $(La,Sr)TiO_3$, $MgO$, $Al_2O_3$, $SrRuO_3$, $RuO$, $Pt$ and $Si$, in particular, a single crystal substrate of $SrTiO_3$, $(La,Sr)TiO_3$ and $MgO$ in which the crystal plane (100) is the substrate plane and which has a lattice constant similar to that of lead piezoelectric thin film such as $Pb(Zr,Ti)O_3$ which generally exhibits excellent ferroelectric properties. A glass substrate or a stainless steel substrate which is not single crystal may also be employed.

Between the substrate 11 and the first intermediate layer 12a, the second intermediate layer 12b which is electrode means functioning as a lower electrode together with an upper electrode which is not shown in the figure is interposed, but a multi-layer structure laminate having the third intermediate layer or more may also be interposed. It is preferable that the material of the second intermediate layer 12b has a small lattice misfit with the substrate 11 or a lower layer film located between the substrate 11 and the second intermediate layer 12b.

More preferably, the second intermediate layer 12b is a single crystal or single oriented film of a metal selected from the group consisting of platinum, palladium, iridium and ruthenium, an oxide thereof, or a perovskite oxide such as $(La,Sr)TiO_3$ and $SrRuO_3$ which exhibits conductivity, of which the growing plane is (100), (010) or (001).

A tetragonal perovskite oxide such as $PT(PbTiO_3)$ having a twin structure or a orthorhombic perovskite oxide such as $SRO(SrRuO_3)$ is preferable for the first intermediate layer 12a, and a single crystal or single oriented film of which the growing plane is (001) and which has a twin plane on (101) or (011) is more preferable. The twin structure of the first intermediate layer 12a relaxes the stress generated in the film when forming a single crystal or single oriented piezoelectric thin film 13, and the film peeling due to stress and the property deterioration of the piezoelectric thin film 13 are avoided, and construction of a large area dielectric thin film element 10 is easy.

The dielectric thin film element 10 shown in FIG. 1A constitutes the main part of a piezoelectric actuator having a film configuration in which a dielectric thin film is sandwiched between electrodes, and the dielectric thin film is the piezoelectric thin film 13 which exhibits piezoelectric property. In the element, an intermediate layer 12 comprising the first intermediate layer 12a and the second intermediate layer 12b which is the lower electrode is located on the substrate 11, and the single crystal or single oriented piezoelectric thin film 13 is formed on the first intermediate layer 12a, and an upper electrode which is not shown in the figure is formed on the piezoelectric thin film 13.

Figure 1B:
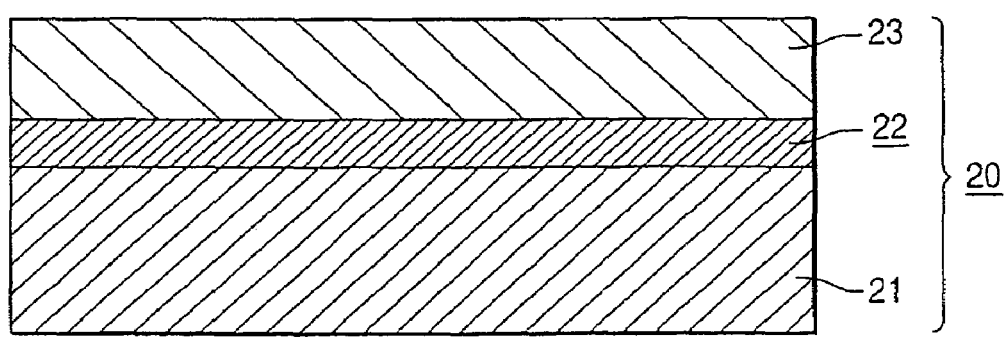

Instead of this configuration, a dielectric thin film element 20 shown in FIG. 1B having a film configuration in which an intermediate layer 22 having a single layer structure of a twin structure thin film and a piezoelectric thin film 23 are laminated on a substrate 21 which has conductivity to function as a lower electrode and also serves as the second intermediate layer shown in FIG. 1A may also be used.

In FIGS. 1A and 1B, when the length of the a-axis of the piezoelectric thin film which is the dielectric thin film is represented by $a_d$, the length of the a-axis of the single layer intermediate layer made of a twin structure thin film or of the first intermediate layer is represented by $a_1$ and the length of the c-axis is represented by $c_1$, it is preferable that each crystal axis holds a relation of $a_1 < a_d < c_1$. More preferably, when the length of the a-axis of single layer intermediate layer having a twin structure or of the first intermediate layer is represented by $a_1$, the length of the c-axis is represented by $c_1$, and the length of the a-axis of the substrate or the second intermediate layer is represented by $a_2$, each crystal axis holds a relation of $a_1 < a_2 < c_1$. By satisfying these relations, the stress generated in the piezoelectric thin film can be relaxed further and the film peeling or the property deterioration of the piezoelectric thin film can be further improved and even larger area dielectric thin film element can be achieved.

For example, when $PbTiO_3$ is used for the first intermediate layer having a twin structure, a single crystal or single oriented second intermediate layer of $SrTiO_3$, $(La,Sr)TiO_3$ or Pt in which (001) is the growing plane is preferable. This is because, referring to the literature values of bulk ceramics, the length of the a-axis $a_2$ of the second intermediate layer is $a_2 = 3.905$ (JCPDS-350734) in the case of $SrTiO_3$ and $a_2 = 3.923$ (JCPDS-040802) in the case of Pt, while the literature value of the length of the a-axis of tetragonal $PbTiO_3$ (JCPDS-060452) is $a_1 = 3.899$ and the length of the c-axis is $c_1 = 4.153$, which satisfy the aforementioned relation $a_1 < a_2 < c_1$.

For the piezoelectric thin film, a single crystal or single oriented dielectric thin film having a lead perovskite structure in which (001) is the growing plane is preferable. For example, a laminate structure of $Pb(Zr,Ti)O_3/PbTiO_3/Pt/MgO$ is preferable as a piezoelectric driving element having a film configuration of FIG. 1A of (piezoelectric thin film/first intermediate layer/second intermediate layer/substrate), and a laminate structure of $Pb(Zr,Ti)O_3/PbTiO_3/(La,Sr)TiO_3$ is preferable as a piezoelectric driving element having a film configuration of FIG. 1B of (piezoelectric thin film/intermediate layer/substrate). This is because, regarding the literature values of the bulk ceramics of tetragonal $Pb(Ti_{0.48},Zr_{0.52})O_3$ (JCPDS-330784), the length of the a-axis is $a_d = 4.036$, which satisfies the aforementioned relation $a_1 < a_d < c_1$. The piezoelectric thin film may be a non-lead $BiTiO_3$ or $BaTiO_3$ ferrodielectric thin film or an $SrTiO_3$ dielectric thin film.

For the single crystal or single oriented piezoelectric thin film, the following lead dielectric thin films represented by $Pb(Zr,Ti)O_3$ can be selected. Examples thereof include PZT $(Pb(Zr_xTi_{1-x})O_3)$, $PMN(Pb(Mg_xNb_{1-x})O_3)$, $PNN(Pb(Nb_xNi_{1-x})O_3)$, $PSN(Pb(Sc_xNb_{1-x})O_3)$, $PZN(Pb(Zn_xNb_{1-x})O_3)$, $PMN-PT\{(1-y)(Pb(Mg_xNb_{1-x})O_3)-y(PbTiO_3)\}$, $PSN-PT\{(1-y)(Pb(Sc_xNb_{1-x})O_3)-y(PbTiO_3)\}$ and $PZN-PT\{(1-y)(Pb(Zn_xNb_{1-x})O_3)-y(PbTiO_3)\}$.

Here, x and y are a number of not more than 1 and not less than 0. In the case of PMN, for example, x is 0.2 to 0.5, and in PSN, x is preferably 0.4 to 0.7, and it is preferable that y in PMN—PT is 0.2 to 0.4, y in PSN—PT is 0.35 to 0.5, and y in PZN—PT is 0.03 to 0.35. In addition, a composition such as La-doped PZT:PLZT$((Pb,La)(Zr,Ti)O_3)$, in which a trace amount of an element such as La is doped to the above main component may be used.

The single crystal or single oriented thin film refers to a film which has a film orientation degree of not less than 90%, preferably not less than 99% according to the 2θ/θ measurement in an X-ray diffraction. An orientation degree of less than 90% is not preferable because the dielectric, pyroelectric, piezoelectric and ferroelectric properties of the dielectric thin film decrease remarkably.

In addition, as for the method of manufacturing a single crystal or single oriented piezoelectric thin film, the first intermediate layer and the second intermediate layer, single crystallization can be conducted by film forming by a sputtering method, while heating the substrate. For example, when a PZT film is formed by a sputtering method, an RF magnetron sputtering method is preferable. The film forming conditions in the RF magnetron sputtering method include a substrate temperature of not less than 500° C. to not more than 700° C. during film forming, an argon/oxygen ratio under argon/oxygen atmosphere of not less than 20/1 to not more than 50/1, a gas pressure of not less than 0.2 Pa to not more than 0.5 Pa, an RF input power of not less than 0.5 W/cm² to not more than 1.2 W/cm² and a substrate cooling rate after film forming of not less than 65° C./min. A more preferable conditions include an argon/oxygen ratio during film forming of not less than 30/1 to not more than 50/1, a gas pressure of not less than 0.2 Pa to not more than 0.3 Pa, an RF input power of not less than 0.5 W/cm² to not more than 0.8 W/cm² and a substrate cooling rate after film forming of not less than 30° C./min. In particular, in the system to which a dopant such as La is added, the substrate temperature can be lower and the RF input power can be set higher. When heating the substrate, an infrared heating method or a resistive heating method can be employed.

In particular, in the intermediate layer (the first intermediate layer) comprising a thin film having a twin structure, the twin structure is easily formed by heat treating by varying temperatures by tens of degrees during heat sputtering in the film forming or subsequent heating steps such as annealing. Alternatively, an intermediate layer having a similar twin structure can be obtained by MOCVD, a sol-gel method, MBE, a PLD method or a hydrothermal synthesis method.

The dielectric thin film element according to this embodiment affords a high density piezoelectric actuator having high piezoelectric property because the piezoelectric thin film is single oriented crystal or single crystal. In addition, because the stress generated in the piezoelectric actuator can be relaxed by the twin structure of the intermediate layer, construction of a large area dielectric thin film element becomes possible, thereby enabling construction of a large area piezoelectric actuator.

In addition, in the piezoelectric actuator of this embodiment, in the case that the substrate 11 does not exhibit conductivity in the configuration shown in FIG. 1A, the second intermediate layer 12b needs to be an electrode having conductivity. In the case that the second intermediate layer 12b does not exhibit conductivity, the substrate 11 needs to have conductivity and functions an electrode When a layer which exhibits conductivity is not formed under the piezoelectric thin film, for example, when the substrate 21 in FIG. 1B does not have conductivity, the substrate 21 can be used as an intermediate transferring member. That is, an intermediate layer 22 is located on an intermediate transferring member, and a single crystal or single oriented piezoelectric thin film 23 is located on the intermediate layer 22, and a piezoelectric film laminate in which an electrode not shown in the figure is formed on the piezoelectric thin film 23 is jointed to a structural body such as a vibrating plate of a liquid discharge head, and then the intermediate transferring member comprising the substrate 21 is removed.

In this case, the substrate 21 which is the intermediate transferring member does not exist in the layer structure of the piezoelectric actuator on the liquid discharge head. In this way, the layer structure of the piezoelectric actuator using the substrate 21 as an intermediate transferring member includes an intermediate layer 22, a piezoelectric thin film 23 and a first electrode thereon, and in addition, a second electrode on the exposed surface of the intermediate layer 22 from which the intermediate transferring member is removed.

As described above, a piezoelectric actuator utilizing an intermediate transferring member can also achieve a high density piezoelectric actuator having high piezoelectric property because the piezoelectric thin film is single oriented crystal or single crystal. In addition, because the stress of the piezoelectric thin film formed on the intermediate transferring member can be relaxed by the twin structure of the intermediate layer, construction of a large area piezoelectric thin film becomes possible, thereby enabling construction of a large area piezoelectric actuator.

Figure 2A:
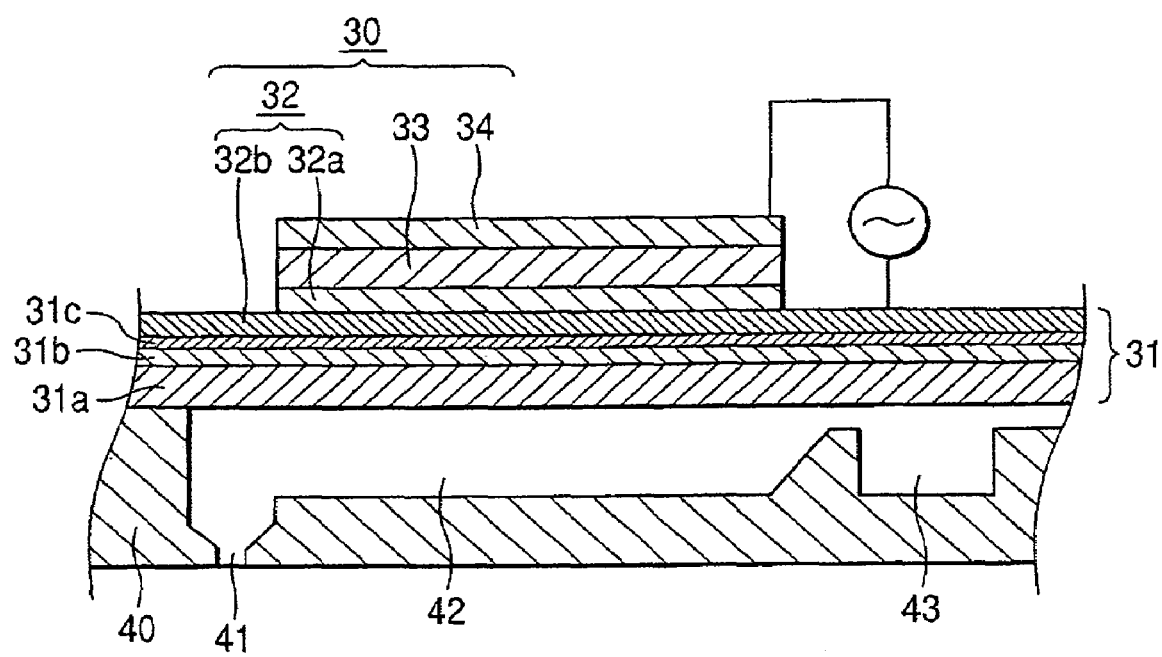
FIGS. 2A and 2B are views illustrating a liquid discharge head of a second embodiment.
Figure 2B:
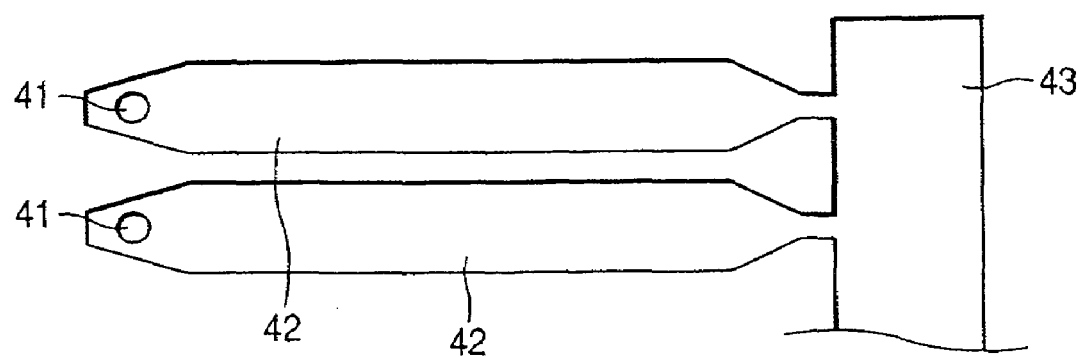

FIGS. 2A and 2B illustrate a liquid discharge head according to a second embodiment, mounted with a piezoelectric actuator having a substrate 31 which is a vibrating plate driven by a dielectric thin film element 30 which is a piezoelectric driving element. The dielectric thin film element 30 constitutes a piezoelectric driving element which comprises an intermediate layer 32 made up of a first intermediate layer 32a which is a thin film having a twin structure and a second intermediate layer 32b which is a lower electrode, a piezoelectric thin film 33 which is a dielectric thin film, and an upper electrode 34. The substrate 31 is formed as a vibrating plate for closing the opening part of a pressure chamber 42 on the main body 40 comprising a discharge port 41 which is a nozzle, the pressure chamber 42 communicated to the discharge port 41 and a flow path substrate such as a Si substrate which has a liquid supply chamber 43.

For the piezoelectric vibrating part of the liquid discharge head, a piezoelectric actuator which has the above-mentioned piezoelectric driving element on the substrate 31 which also serves as a vibrating plate is used. The piezoelectric thin film 33 and the upper electrode 34 are segmented by patterning along with the shape of the pressure chamber 42 as shown in FIG. 2B. The discharge port 41 on the main body 40 has a shape of a nozzle, and the pressure in the pressure chamber 42 fluctuates due to the displacement of the piezoelectric vibrating part to discharge liquid such as ink supplied from the liquid supply chamber 43 from the discharge port 41.

The segmentation of the piezoelectric thin film 33 and the upper electrode 34 may or may not correspond to each pressure chamber 42. In addition, a resin having low rigidity which does not prevent expansion and contraction of the piezoelectric thin film 33 may be present between the segmented piezoelectric thin film 33. The shape of the pressure chamber 42 may be selected from the group consisting of a rectangle, a circle and an ellipse. In the case of a side-shooter, the cross section of the pressure chamber 42 may be narrowed to the nozzle direction.

The substrate 31 constituting the vibrating plate has, for example, a $SiO_2$ film 31a, a Si (100) film 31b or a MgO (100) film 31c and the second intermediate layer 32b is a Pt (100) film.

Specific examples 1 to 16 of the layer structure of the liquid discharge head of this embodiment are listed below. The layer structure of each example is indicated by upper electrode//piezoelectric thin film//first intermediate layer//lower electrode (second intermediate layer)//vibrating plate//substrate (main body). At least the piezoelectric thin film, the lower electrode and the vibrating plate are formed by epitaxial growth and due to the twin structure of the first intermediate layer, the stress generated between the piezoelectric thin film and a laminate comprising a lower electrode, a vibrating plate and a substrate (main body) can be relaxed. The first intermediate layer or the intermediate layer having a twin structure is underlined. In addition, as shown in FIG. 1B, a structure in which one layer simultaneously satisfies the functions of the lower electrode, the vibrating plate and the substrate (main body) may also be employed.

Ex. 1 Pt//PZT(001)/<u>PT(001)</u>//Pt(100)//MgO(100)//Si(100)
Ex. 2 Pt//PZT(001)/<u>PT(001)</u>//Pt(100)//STO(100)//Si(100)
Ex. 3 Au//PZT(001)/<u>PT(001)</u>//LSTO(100)//Si(100))/$SiO_2$/Si(100)
Ex. 4 Pt//PZT(001)/<u>PT(001)</u>//Pt(100)//$Al_2O_3$(100)//Si(100)
Ex. 5 Pt//PZT(111)/<u>PT(111)</u>//Pt(111)//YSZ(100)/Zr//Si(100)
Ex. 6 Ag/PZT(001)//<u>BT(001)</u>//Pt(100)//$LaAlO_3$(100)//Si(100)
Ex. 7 Au//PZT(001)/<u>PT(001)</u>//Pt(100)//YSZ(111)/$SiO_2$//Si(111)
Ex. 8 Ir//PZT(001)/<u>PT(001)</u>//Ir(100)//$SiO_2$//Si(100)
Ex. 9 Au//PZT(111)/<u>PT(111)</u>//Pt(111)//YSZ(100)/$SiO_2$//Si(100)
Ex. 10 Au//PZT(001)//<u>SRO(001)</u>//Si(100)
Ex. 11 Pt//PZT(111)/<u>PT(111)</u>//Pt(111)//MgO(111)//Si(100)
Ex. 12 $IrO_2$//PZT(001)/<u>BT</u>//SRO(001)//Si(100)
Ex. 13 Au//PZT(001)/<u>PT(001)</u>//Pt(100)//MgO(100)
Ex. 14 Au//PZT(001)/<u>PT(001)</u>//Pt(100)//STO(100)
Ex. 15 Pt//PZT(001)/<u>PT(001)</u>//LSTO(100)
Ex. 16 Au//PZT(001)/<u>PT(001)</u>//Pt(100)//$Al_2O_3$(100)

In the above specific examples, PZT has been exemplified as the piezoelectric thin film, but a modified layer structure including a lead piezoelectric thin film such as PMN, PZN, PSN, PNN, PMN—PT, PSN—PT and PZN—PT may also be employed. In addition, a composition such as La-doped PZT:PLZT((Pb,La) (Zr,Ti)$O_3$) in which a trace amount of an element such as La is doped to the above main component may also be used. Here, BT is an abbreviation of (BaTiO$_3$), and YSZ is an abbreviation of yttria added stabilized zirconia.

As a modified case of this embodiment, a structure in which the layer structure of intermediate layer//piezoelectric thin film//electrode (lower electrode), which is the intermediate transferring member on the substrate, is transferred to the main body of the liquid discharge head may also be used. In this case, the liquid discharge head has a main body having a pressure chamber communicated to the discharge port and a piezoelectric vibrating part formed so as to close the opening part of the pressure chamber, and as the electrode surface of the structural body of the intermediate transferring member and the vibrating plate of the piezoelectric vibrating part are jointed and then the intermediate transferring member is removed, the intermediate transferring member does not exist at the piezoelectric vibrating part.

The layer structure of the piezoelectric vibrating part in this case includes, in addition to the above-mentioned intermediate layer, the piezoelectric thin film and the first electrode (lower electrode), the second electrode (upper electrode) on the surface from which the intermediate transferring member is removed. In addition, at least the piezoelectric thin film, the intermediate layer and the upper electrode are segmented, the discharge port of the main body has a shape of a nozzle. The pressure in the pressure chamber fluctuates due to the displacement of the piezoelectric vibrating part and liquid such as ink supplied from the liquid supply chamber is discharged from the discharge port.

The segmentation of the piezoelectric thin film and the electrode may or may not correspond to each pressure chamber. In addition, a resin having low rigidity which does not prevent expansion and contraction of the piezoelectric thin film may be present between the segmented piezoelectric thin film. The shape of the pressure chamber may be selected from the group consisting of a rectangle, a circle and an ellipse. In the case of a side-shooter, the cross section of the pressure chamber may be narrowed to the nozzle direction.

In the above-mentioned piezoelectric actuator, the piezoelectric displacement of the piezoelectric thin film is dependent on the effective electric field applied to the piezoelectric thin film, and therefore it is preferable that the film thickness of the first intermediate layer (intermediate layer) having a twin structure is small, which is not less than 3 nm to not more than 200 nm. A film thickness of more than 200 nm is not preferable because the effective electric field applied to the piezoelectric thin film is decreased and the piezoelectric displacement of the piezoelectric thin film becomes small. A film thickness of less than 3 nm is not preferable because the twin structure of the first intermediate layer (intermediate layer) cannot be formed.

According to this embodiment, because the piezoelectric thin film of the piezoelectric actuator is single oriented crystal or single crystal, high density and high discharge ability can be achieved while corresponding to high frequency. In addition, because the intermediate layer has a twin structure, the stress generated in the piezoelectric vibrating part can be relaxed, the film peeling is prevented and a large size liquid discharge head can be achieved.

EXAMPLE 1

Figure 3:
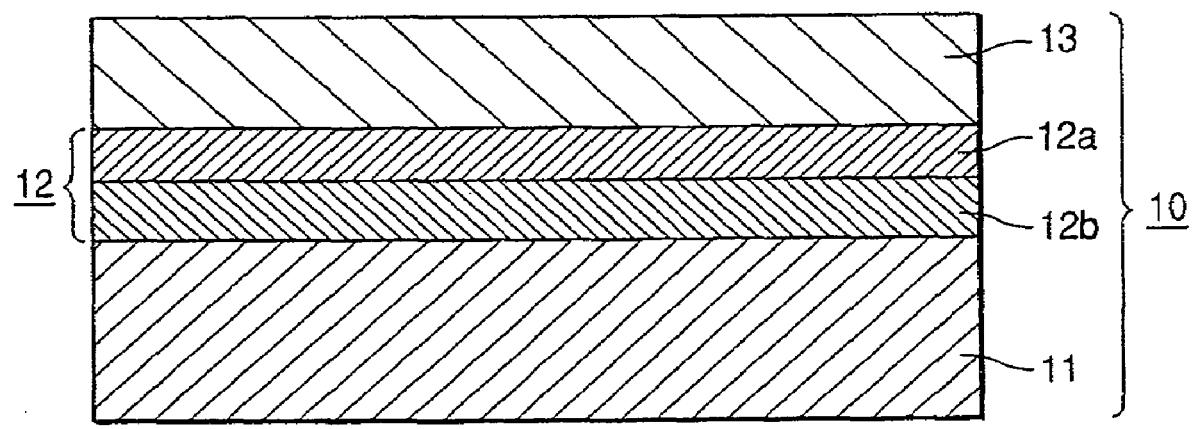
FIG. 3 is a view illustrating the film configuration of Example 1.
Figure 4:
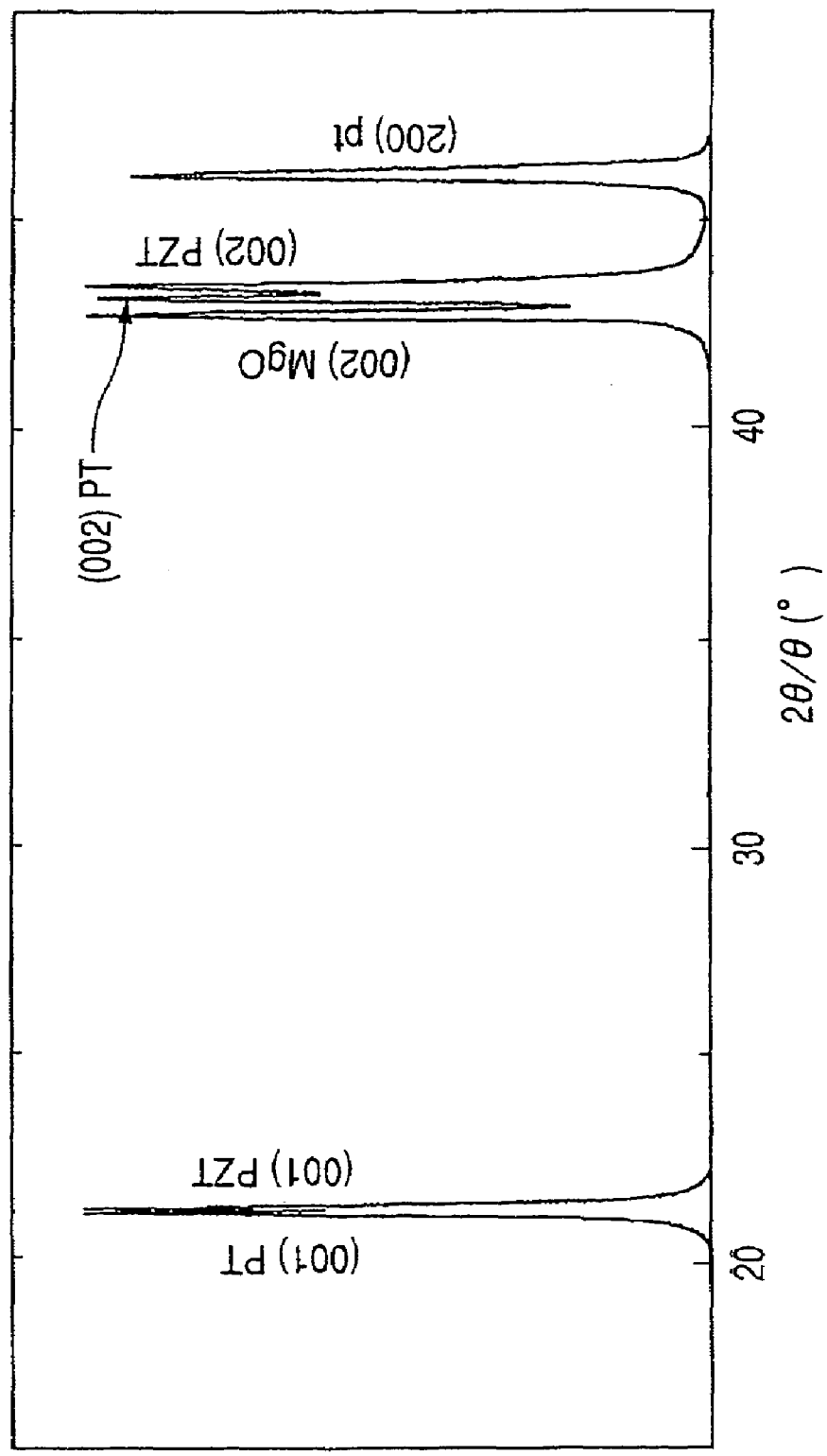
FIG. 4 is an XRD chart of Example 1.

As for the film configuration of the dielectric thin film element (piezoelectric driving element) of this Example shown in FIG. 3, 0.2 μm of Pt(001) was epitaxially grown on a substrate of MgO(001)(single crystal substrate) by sputtering while heating at not less than 500° C. as the second intermediate layer which also serves as an electrode, 0.2 μm of PT(001) was epitaxially grown thereon at not less than 500° C. as the first intermediate layer, and then 2 μm of PZT was epitaxially grown as a piezoelectric thin film. In all of the film forming steps, the substrate was cooled rapidly after the film forming at not less than 30° C./min. The composition of PZT in the film forming was $Pb(Zr_{0.47},Ti_{0.53})O_3$. In addition, the substrate heating temperature of PT (001) which is the first intermediate layer was 605° C. during the film forming, which was intentionally changed within a range of ±25° C. to form a twin structure thin film. The result of the measurement according to XRD of the single crystallinity of the thus obtained dielectric thin film element is shown in FIG. 4. From this X-ray diffraction pattern, it was confirmed that the orientation of PZT was not less than 99% in (001).

An electron diffraction of PZT was conducted by introducing electron beam from (010), which is perpendicular to the substrate normal axis, and as a result, it was confirmed that the PZT had a single crystal structure of which the film growing plane was (001). In addition, an electron diffraction of PT was conducted by introducing electron beam from (010), which is perpendicular to the substrate normal axis, and as a result, it was confirmed that PT had a twin structure of which the film growing plane was (001).

Figure 5:
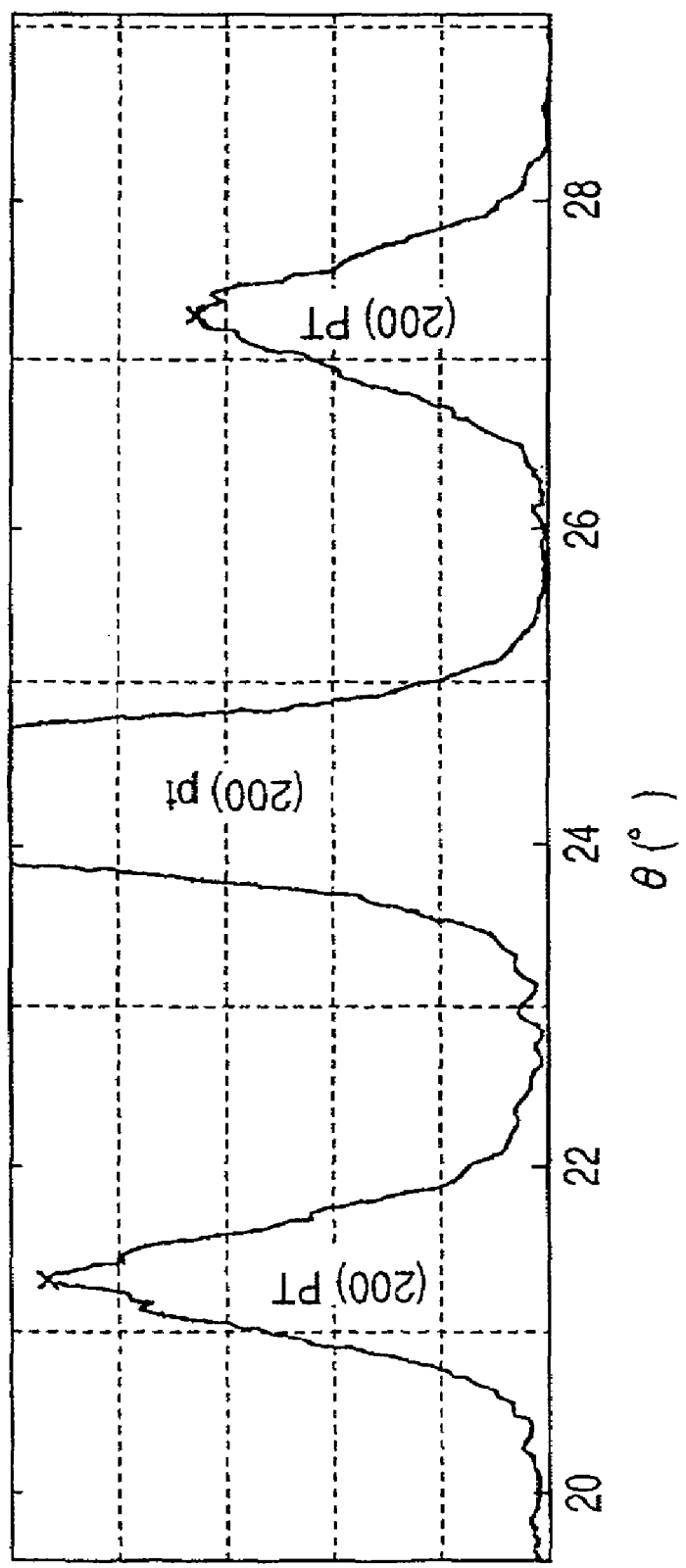
FIG. 5 is a chart showing an XRD rocking curve pattern of PT of Example 1.

Further, a rocking curve measurement (ω scan) of PT was conducted by XRD in which the 2θ axis was fixed at a face spacing corresponding to the a-axis of PT. The results are shown in FIG. 5. From this X-ray diffraction pattern, it was confirmed that PT had a twin structure in which (100) was the twin plane. The twin structure can also be confirmed from the cross-sectional TEM dark field image of PT formed on (200).

In addition, according to an XRD measurement, the lattice constants of Pt which is the second intermediate layer, PT which is the first intermediate layer and the piezoelectric thin film PZT were evaluated. As a result, it was found that the length of the a-axis of PZT $a_d$=4.04, the length of the a-axis of PT $a_1$=3.90 and the length of the c-axis of PT $c_1$=4.16 had a relation of $a_1 < a_d < c_1$ and the length of the a-axis of PT $a_1$=3.90, the length of the c-axis of PT $c_1$=4.16 and the length of the a-axis of Pt $a_2$=3.93 had a relation of $a_1 < a_2 < c_1$. In addition, the length of the a-axis of PZT $a_d$=4.04 is equivalent to a=4.036, which is the literature value of the bulk ceramics of Zr/Ti=52/48 (JCPDS-330784), proving that the stress was relaxed even in the case of an epitaxial film.

EXAMPLE 2

Figure 6:
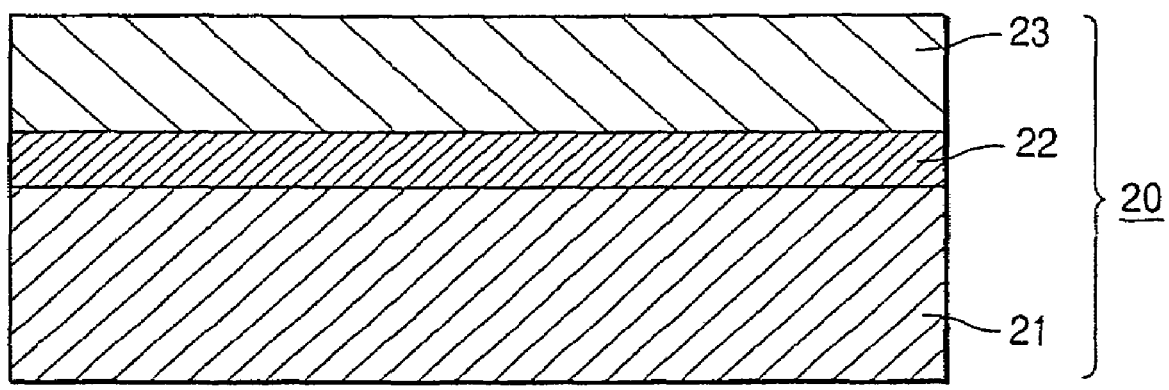
FIG. 6 is a view illustrating the film configuration of Example 2.
Figure 7:
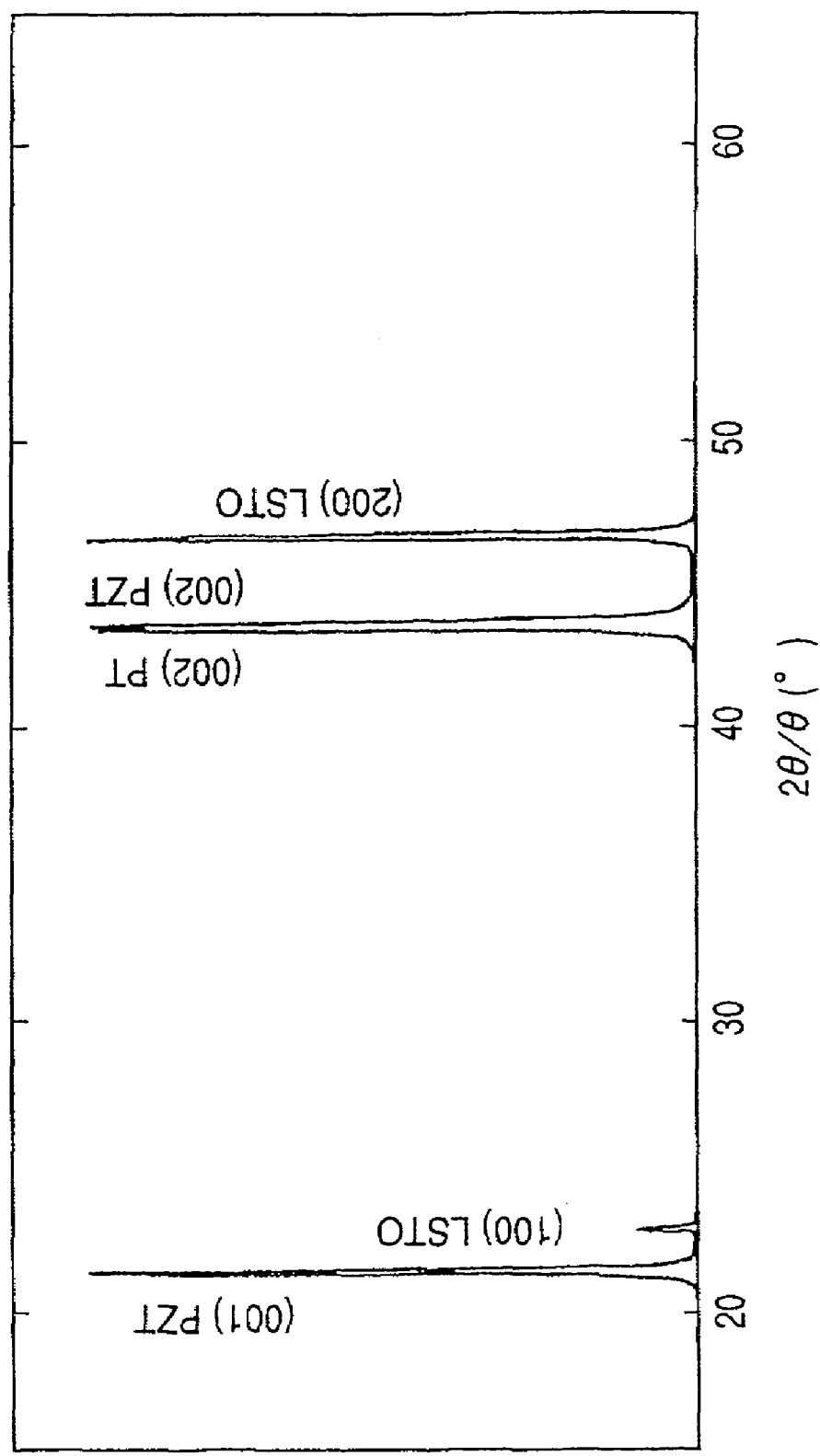
FIG. 7 is an XRD chart of Example 2.

As for the film configuration of the dielectric thin film element (piezoelectric driving element) of this Example shown in FIG. 6, 0.1 μm of PT(001) was epitaxially grown on a substrate of (La,Sr)TiO₃ (001)(single crystal substrate) which also serves as a lower electrode at not less than 500° C. as an intermediate layer, and then 3 μm of PZT was epitaxially grown as a piezoelectric thin film. In all of the film forming steps, the substrate was cooled rapidly after the film forming at not less than 30° C./min. The composition of PZT in the film forming was $Pb(Zr_{0.47},Ti_{0.53})O_3$. In addition, the substrate heating temperature of PT (001) which is the first intermediate layer was 605° C. during the film forming, which was intentionally changed within a range of ±25° C. to form a twin structure thin film. The result of the measurement according to XRD of the single crystallinity of the thus obtained dielectric thin film element is shown in FIG. 7. From this X-ray diffraction pattern, it was confirmed that the orientation of PZT was nearly 100% in (001).

An electron diffraction of PZT was conducted by introducing electron beam from (010), which is perpendicular to the substrate normal axis, and as a result, it was confirmed that PZT had a single crystal structure of which the film growing plane was (001). In addition, an electron diffraction of PbTiO₃ was conducted by introducing electron beam from (010), which is perpendicular to the substrate normal axis, and as a result, it was confirmed that PT had a twin structure of which the film growing plane was (001). Similarly, from the rocking curve measurement (ω scan) of PT and the cross-sectional TEM dark field image of PT formed on (200), it was confirmed that as in Example 1, PT had a film growing plane (001) and a twin structure in which (100) was the twin plane.

The piezoelectric thin film of the thus obtained piezoelectric driving element was subjected to an adhesion test according to a cross cut test, and it was proved that no peeling was observed and the adhesion was excellent as in Example 1. When the a-axis of PZT was measured by an XRD, $a_d$ was 4.04 and equivalent to the literature value of the bulk ceramics of Zr/Ti=52/48 (JCPDS-330784), which proved that the stress was relaxed.

EXAMPLE 3

In the construction of the liquid discharge head shown in FIG. 2, MgO(100) which was to be a vibrating plate was formed on Si(100) in a thickness of 0.3 μm using a B-doped single crystal Si(100)/SiO$_2$/Si structure (each film thickness: 2.5 μm/1 μm/250 μm). Further, 0.2 μm of Pt(001) was epitaxially grown thereon as the second intermediate layer which is a lower electrode, 0.1 μm of PT(001) thereon as the first intermediate layer, and then 2 μm of PZT as a piezoelectric thin film. In all of the film forming steps, the substrate was cooled rapidly after the film forming. The composition of PZT in the film forming was Pb(Zr$_{0.47}$, Ti$_{0.53}$)O$_3$.

The substrate heating temperature of PT (001) which is the first intermediate layer was 605° C. during the film forming, which was intentionally changed within a range of ±5° C. to form a film. A dielectric thin film element having a twin structure in the first intermediate layer was formed in this way and Au was paste-coated on the upper electrode.

The Si layer was subjected to a plasma etching using SF$_6$ and C$_4$F$_8$ to form a pressure chamber. Then, the Si substrate constituting a part of the pressure chamber and a nozzle plate having a discharge port were adjoined. The pressure chamber had a width of 60 μm and a depth of 2.2 mm, and the partition of the pressure chambers had a width of 24 μm.

An ink durability test was conducted using this liquid discharge head at a drive frequency of 1 kHz and a drive voltage of 0 V/30 V. As a result, the ink discharge was achieved in all the nozzles (discharge port) up to a discharge number of 10$^7$ which proved that the film peeling of the dielectric thin film element was not found after the durability test.

EXAMPLE 4

A plurality of liquid discharge heads having the same construction as that of Example 3 except that the film thickness of the first intermediate layer PT(001) was 1 nm, 10 nm, 100 nm, 200 nm and 300 nm, respectively, were prepared. An ink discharge test was conducted using these liquid discharge heads at a drive frequency of 10 kHz and a drive voltage of 5 V/20 V. The number of discharge was 10$^7$ in each case and a durability test was conducted simultaneously. The results are shown in Table 1. In the test for the liquid discharge heads in which the film thickness of PT(001) was 10 nm, 100 nm and 200 nm, respectively, the ink discharge was achieved in all the nozzles and the film peeling of the dielectric thin film element was not found after the durability test. On the other hand, the liquid discharge head in which the film thickness of PT(001) was 300 nm failed to discharge ink due to the lack of the discharge power in some nozzles. In addition, in the liquid discharge head in which the film thickness of PT(001) was 1 nm, ink discharge failure due to the film peeling of the dielectric thin film element was observed in a plurality of nozzles, which proved that the film peeling of the dielectric thin film element occurred after the durability test.

TABLE 1

| | PT(001) film thickness (nm) | | | | |
|---|---|---|---|---|---|
| | 1 | 10 | 100 | 200 | 300 |
| Discharge test | ○ | ○ | ○ | ○ | X |
| Durability test | X | ○ | ○ | ○ | ○ |

COMPARATIVE EXAMPLE 1

As a Comparative Example for Example 1, a dielectric thin film element having the same structure as that of Example 1 shown in FIG. 1A except that the first intermediate layer did not have a twin structure was prepared. The substrate heating temperature of PT(001) which is the first intermediate layer was 630° C. during film forming and was fixed within a range of ±2° C. to form a film. The crystallinity of the thus obtained dielectric thin film element was measured by an XRD and it was confirmed that PZT was preferentially oriented in (001).

As a result of an electron diffraction of PZT by introducing electron beam from (010), which is perpendicular to the substrate normal axis, it was confirmed that PZT had a single crystal structure of which the film growing plane was (001). In addition, as a result of an electron diffraction of PT by introducing electron beam from (010), which is perpendicular to the substrate normal axis, it was confirmed that PT also had a single crystal structure of which the film growing plane was (001). Further, when the a-axis of PZT was measured by an XRD, $a_d$ was 4.01 and smaller than the literature value of the bulk ceramics of Zr/Ti=52/48 (JCPDS-330784) of a=4.036, which proved that the stress due to compression was generated.

The piezoelectric thin film of the thus obtained piezoelectric thin film element was subjected to an adhesion test according to a cross cut test. The area of the substrate was 1 cm□, 2 cm□, 3 cm□, 4 cm□ and 5 cm□, and the adhesion of the elements, i.e., the dielectric thin film element of Example 1 in which the first intermediate layer PT had a twin structure and the dielectric thin film element of Comparative Example 1 in which the first intermediate layer PT did not have a twin structure was compared. The results are shown in Table 2. In the dielectric thin film element of Example 1, the piezoelectric thin film was completely free of film peeling in all substrate sizes and the adhesion was excellent. On the other hand, in the dielectric thin film element of Comparative Example 1, the larger the substrate area, the more the peeling and the adhesion was poor.

TABLE 2

| | Substrate area (cm□) | | | | |
|---|---|---|---|---|---|
| | 1 | 2 | 3 | 4 | 5 |
| Having twin structure | No peeling | No peeling | No peeling | No peeling | No peeling |
| No twin | 10% | 20% | 30% | 40% | 50% |

TABLE 2-continued

| | Substrate area (cm□) | | | | |
|---|---|---|---|---|---|
| | 1 | 2 | 3 | 4 | 5 |
| structure | peeling | peeling | peeling | peeling | peeling |

COMPARATIVE EXAMPLE 2

As a Comparative Example of Example 2, a dielectric thin film element having the same structure as that of Example 2 except that the intermediate layer did not have a twin structure was prepared. As in Comparative Example 1, the substrate heating temperature of PT(001) which is the intermediate layer was 630° C. during film forming and was fixed within a range of ±2° C. to form a film. The single crystallinity of the thus obtained dielectric thin film element was measured by an XRD and it was confirmed that PZT was preferentially oriented in (001) as in Example 2.

As a result of an electron diffraction of PZT by introducing electron beam from (010), which is perpendicular to the substrate normal axis, it was confirmed that PZT had a single crystal structure of which the film growing plane was (001). In addition, as a result of an electron diffraction of PT by introducing electron beam from (010), which is perpendicular to the substrate normal axis, it was confirmed that PT also had a single crystal structure of which the film growing plane was (001) as in Comparative Example 1. Further, when the a-axis of PZT was measured by an XRD, $a_d$ was 4.00 and smaller than the literature value of the bulk ceramics of Zr/Ti=52/48 (JCPDS-330784), which proved that the stress due to compression was generated.

The piezoelectric thin film of the thus obtained piezoelectric thin film element was subjected to an adhesion test according to a cross cut test. The area of the substrate was 1 cm□, 2 cm□, 3 cm□, 4 cm□ and 5 cm□, and the adhesion of the two elements, i.e., the dielectric thin film element of Example 2 in which the intermediate layer PT had a twin structure and the dielectric thin film element of Comparative Example 2 in which the intermediate layer PT did not have a twin structure was compared. The results are shown in Table 3. In the dielectric thin film element of Example 2, the piezoelectric thin film was completely free of film peeling in all substrate sizes and the adhesion was excellent. On the other hand, in the dielectric thin film element of Comparative Example 2, the larger the substrate area, the more the peeling and the adhesion was poor.

TABLE 3

| | Substrate area (cm□) | | | | |
|---|---|---|---|---|---|
| | 1 | 2 | 3 | 4 | 5 |
| Having twin structure | No peeling | No peeling | No peeling | No peeling | No peeling |
| No twin structure | 20% peeling | 30% peeling | 40% peeling | 50% peeling | 60% peeling |

COMPARATIVE EXAMPLE 3

As a Comparative Example of Example 3, a liquid discharge head having the same structure as that of Example 3 except that the first intermediate layer did not have a twin structure was prepared. The substrate heating temperature of PT(001) which is the first intermediate layer was 630° C. during film forming and fixed within a range of ±2° C. to form a film.

An ink durability test was conducted using this liquid discharge head at a drive frequency of 1 kHz and a drive voltage of 0 V/30 V. As a result, ink discharge failure due to the film peeling of the dielectric thin film element was observed in a plurality of nozzles up to a discharge number of $10^7$, which proved that the film peeling of the dielectric thin film element occurred after the durability test.

This application claims priority from Japanese Patent Application No. 2003-411167 filed on Dec. 10, 2003, which is hereby incorporated by reference herein.

What is claimed is:

1. A dielectric thin film element comprising:
   an intermediate layer formed on a substrate; and
   a single crystal or single oriented dielectric thin film formed on the intermediate layer,
   wherein the intermediate layer has a twin structure having a twin plane.

2. A piezoelectric actuator comprising:
   a vibrating plate;
   an intermediate layer formed on the vibrating plate; and
   a single crystal or single oriented piezoelectric thin film formed on the intermediate layer,
   wherein the intermediate layer has a twin structure having a twin plane.

3. The piezoelectric actuator according to claim 2, wherein the piezoelectric thin film is a lead piezoelectric thin film and wherein the intermediate layer has a thin film of $PbTiO_3$ or $SrRuO_3$.

4. A liquid discharge head which pressurizes liquid in a pressure chamber by a piezoelectric driving force to discharge the liquid through a discharge port, said head comprising:
   a flow path substrate equipped with the pressure chamber;
   a vibrating plate provided corresponding to the pressure chamber;
   an intermediate layer formed on the vibrating plate;
   a single crystal or single oriented piezoelectric thin film formed on the intermediate layer; and
   an electrode for supplying current to the piezoelectric thin film,
   wherein the intermediate layer has a twin structure having a twin plane.

5. The liquid discharge head according to claim 4, wherein the intermediate layer has a tetragonal thin film and (001) is the main growing plane.

6. The liquid discharge head according to claim 4, wherein the intermediate layer has an orthorhombic thin film and (001) is the main growing plane.

7. The liquid discharge head according to claim 4, wherein the intermediate layer has a thin film of $PbTiO_3$ or $SrRuO_3$.

8. The liquid discharge head according to claim 4, wherein the twin plane of the intermediate layer is (101) or (011).

9. The liquid discharge head according to claim 4, wherein the thin film having a twin structure has a film thickness of 1 to 200 nm.

* * * * *